(12) United States Patent
 Kaelberer et al.

(10) Patent No.: US 9,156,675 B2
(45) Date of Patent: Oct. 13, 2015

(54) MICROMECHANICAL COMPONENT AND MANUFACTURING METHOD FOR A MICROMECHANICAL COMPONENT

(71) Applicants: Arnd Kaelberer, Schlierbach (DE); Jochen Reinmuth, Reutlingen (DE); Johannes Classen, Reutlingen (DE)

(72) Inventors: Arnd Kaelberer, Schlierbach (DE); Jochen Reinmuth, Reutlingen (DE); Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/322,106

(22) Filed: Jul. 2, 2014

(65) Prior Publication Data
US 2015/0008542 A1    Jan. 8, 2015

(30) Foreign Application Priority Data

Jul. 4, 2013   (DE) .......................... 10 2013 213 071

(51) Int. Cl.
| | |
|---|---|
| B81B 3/00 | (2006.01) |
| B81C 1/00 | (2006.01) |
| G01L 9/00 | (2006.01) |
| H04R 19/04 | (2006.01) |
| H04R 31/00 | (2006.01) |

(52) U.S. Cl.
CPC .............. *B81B 3/0037* (2013.01); *B81B 3/0021* (2013.01); *B81C 1/00682* (2013.01); *G01L 9/0072* (2013.01); *H04R 19/04* (2013.01); *H04R 31/00* (2013.01); *B81B 2201/0257* (2013.01); *B81B 2201/0264* (2013.01); *B81B 2203/0127* (2013.01); *B81B 2207/012* (2013.01); *B81B 2207/095* (2013.01)

(58) Field of Classification Search
CPC .............. B81B 2203/0127; B81B 2203/0315; B81B 2203/053
See application file for complete search history.

(56) References Cited

U.S. PATENT DOCUMENTS

| | | | |
|---|---|---|---|
| 2007/0261910 A1 | 11/2007 | Kasai et al. | |
| 2009/0026561 A1* | 1/2009 | Reichenbach et al. | ........ 257/416 |
| 2009/0181489 A1 | 7/2009 | Horimoto et al. | |
| 2010/0164023 A1* | 7/2010 | Knese et al. | ................... 257/415 |
| 2012/0042731 A1* | 2/2012 | Lin et al. | .......................... 73/718 |
| 2012/0161257 A1* | 6/2012 | Friza et al. | ..................... 257/416 |

FOREIGN PATENT DOCUMENTS

| | | |
|---|---|---|
| DE | 42 27 819 | 2/1993 |
| DE | 198 20 758 | 12/1999 |
| DE | 10 2007 019 639 | 10/2008 |

* cited by examiner

*Primary Examiner* — Yu-Hsi D Sun
*Assistant Examiner* — Wasiul Haider
(74) *Attorney, Agent, or Firm* — Kenyon & Kenyon LLP

(57) ABSTRACT

A micromechanical component includes a substrate having a cavern structured into the same, an at least partially conductive diaphragm, which at least partially spans the cavern, and a counter electrode, which is situated on an outer side of the diaphragm oriented away from the substrate so that a clearance is present between the counter electrode and the at least partially conductive diaphragm, the at least partially conductive diaphragm being spanned onto or over at least one electrically insulating material which at least partially covers the functional top side of the substrate, and at least one pressure access being formed on the cavern so that the at least partially conductive diaphragm is bendable into the clearance when a gaseous medium flows from an outer surroundings of the micromechanical component into the cavern. Also described is a manufacturing method for a micromechanical component.

26 Claims, 16 Drawing Sheets

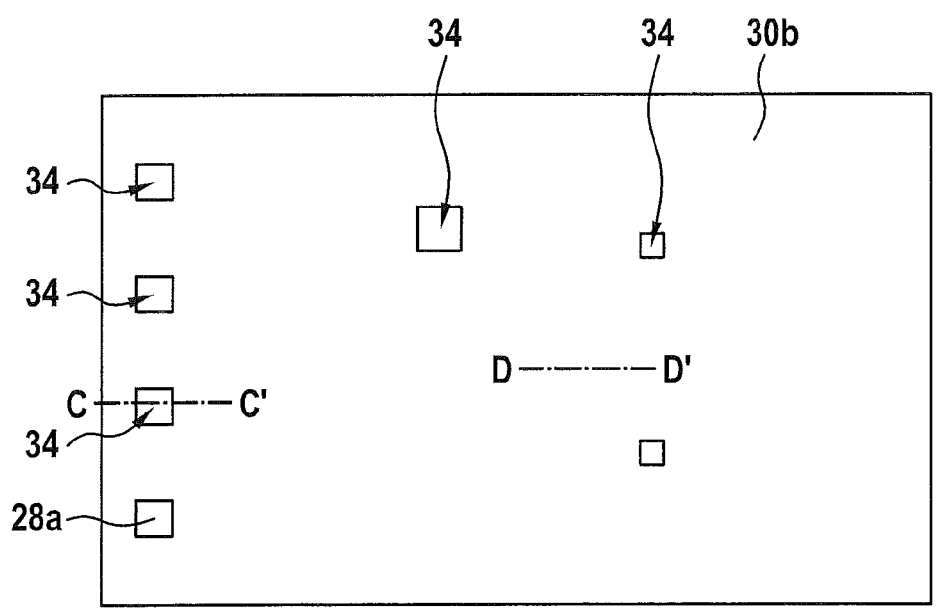

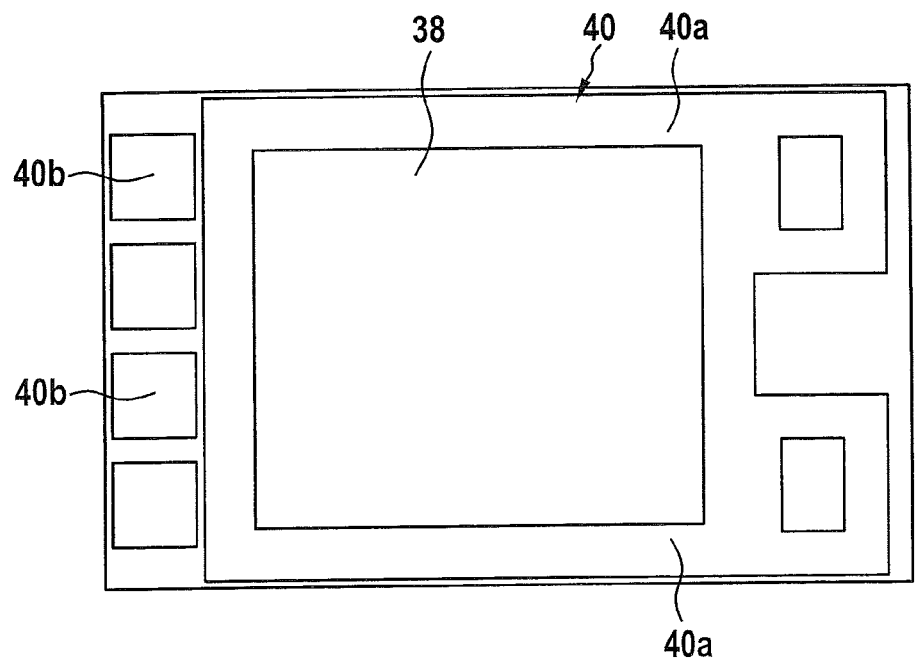
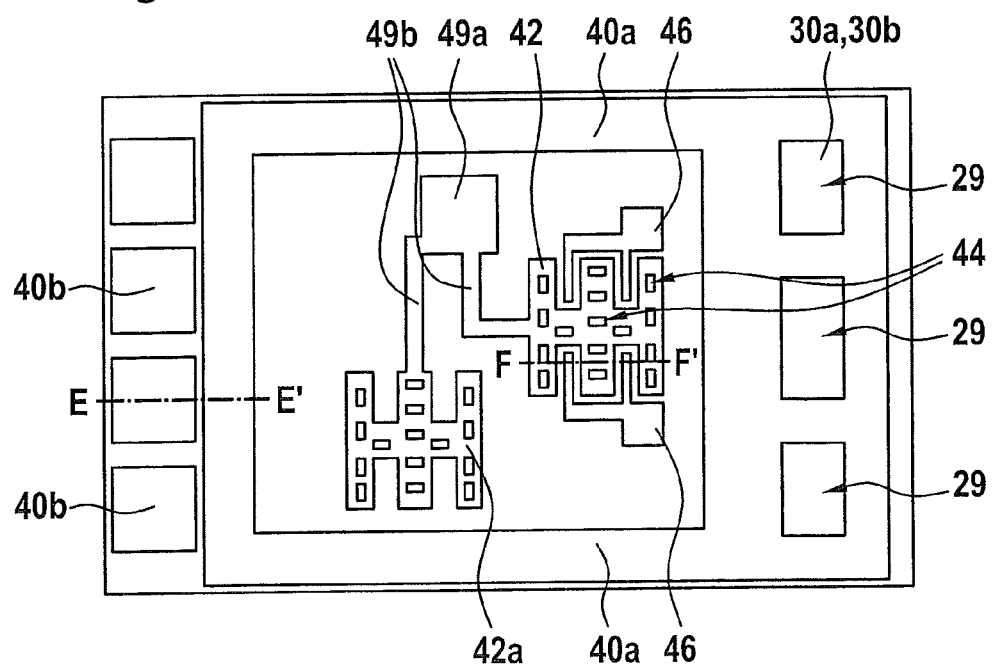

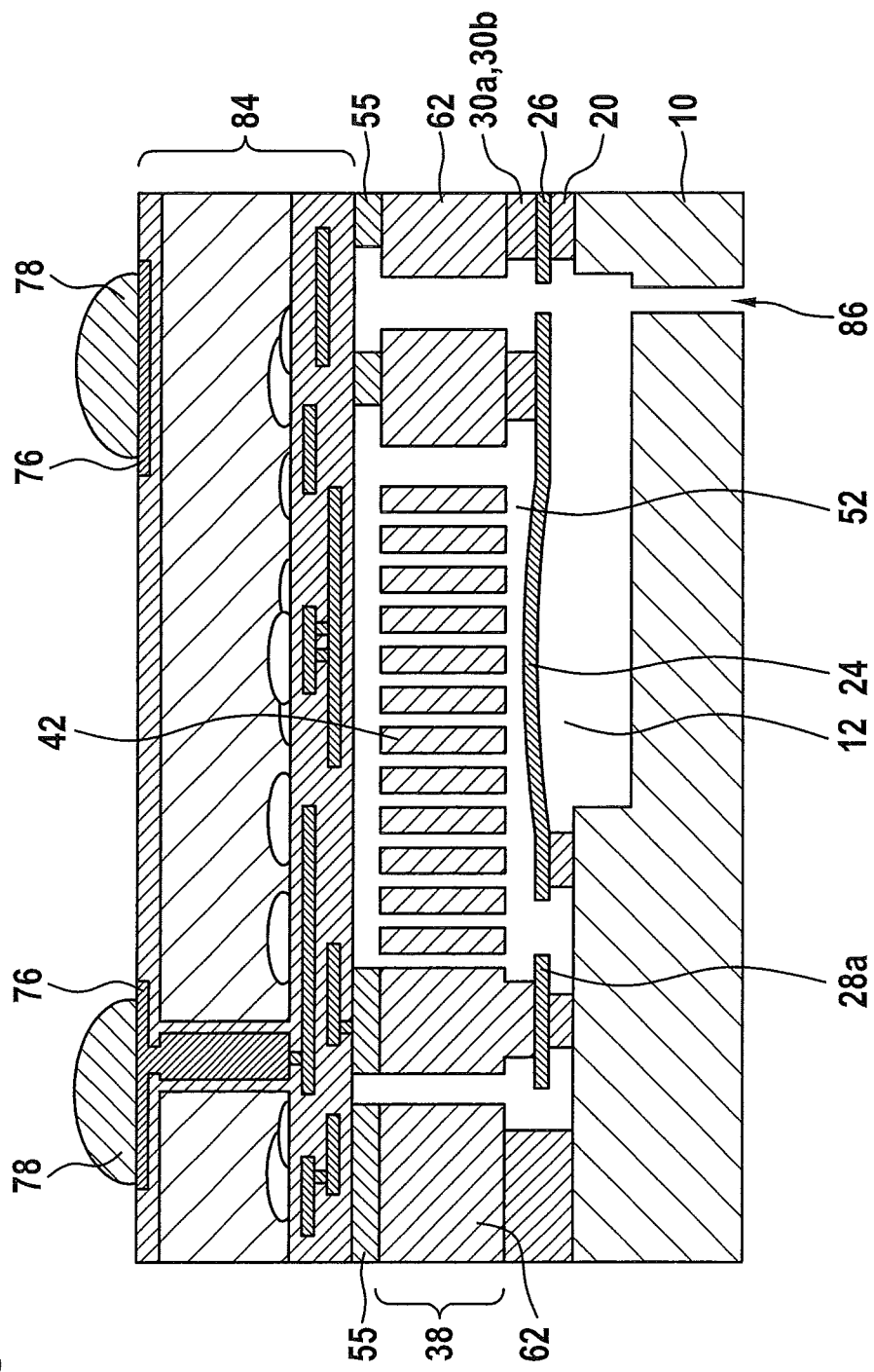

MICROMECHANICAL COMPONENT AND MANUFACTURING METHOD FOR A MICROMECHANICAL COMPONENT

RELATED APPLICATION INFORMATION

The present application claims priority to and the benefit of German patent application no. 10 2013 213 071.6, which was filed in Germany on Jul. 4, 2013, the disclosure of which is incorporated herein by reference.

FIELD OF THE INVENTION

The present invention relates to a micromechanical component. The present invention also relates to a capacitive sensor device and to a microphone. The present invention further relates to manufacturing methods for a micromechanical component, for a capacitive sensor device and for a microphone.

BACKGROUND INFORMATION

German patent document DE 10 2007 019 639 A1 discusses a micromechanical component including a diaphragm for covering a cavity, the diaphragm being directly attached to a functional top side of a substrate and made of monocrystalline silicon. An electrode is suspended on an outer side of the diaphragm which is directed away from the cavity. The diaphragm and the electrode are to be usable as sensor elements of a capacitive pressure sensor.

SUMMARY OF THE INVENTION

The present invention creates a micromechanical component having the features described herein, a capacitive sensor device having the features described herein, a microphone having the features described herein, a manufacturing method for a micromechanical component having the features described herein, a manufacturing method for a capacitive sensor device having the features described herein, and a manufacturing method for a microphone having the features described herein.

The bendability of the diaphragm may be increased by situating the at least one electrically insulating material between the at least partially conductive diaphragm and the functional top side of the substrate. Moreover, the electrical insulation of the diaphragm thus implemented with respect to the adjoining areas of the functional top side of the substrate may be used to form the inner side of the diaphragm oriented toward the cavern from at least one conductive material. The conventional embedding of a conductive intermediate layer into the diaphragm may thus be dispensed with. The micromechanical component thus has a simpler layer structure for the diaphragm. In particular, the diaphragm may be formed of/structured out of a single layer.

Moreover, due to the advantageous configuration of the micromechanical component with the at least one pressure access, the diaphragm is also pressurizable from a rear side of the substrate directed away from the functional top side and/or from a side plane of the micromechanical component situated between the functional top side and the rear side of the substrate. The present invention thus increases the configuration freedom when creating a capacitive sensor device and/or a microphone.

In one advantageous specific embodiment, a plurality of trenches is formed in the substrate in such a way that a bottom surface of the cavern is divided by the plurality of trenches. As will be described in greater detail below, it is easier to undercut the diaphragm during the manufacture of the micromechanical component with the aid of at least one cavity formed in the plurality of trenches. The conventional necessity to create recesses/etch openings in the diaphragm for undercutting the same is thus also eliminated. Accordingly, it is thus also not necessary to subsequently seal the recesses/etch openings in the undercut diaphragm with a sealing layer. The micromechanical component according to the present invention is thus easier and more cost-effective to manufacture.

As an alternative or in addition, it is then also possible to create a plurality of depressions on an inner side of the at least partially conductive diaphragm, which is exposed from the cavern. At least one second cavity in the plurality of depressions may also facilitate undercutting of the diaphragm. As a result, the manufacturability of the micromechanical component is also simplified in this case.

The above-described advantages are also implemented in a capacitive sensor device or in a microphone including such a micromechanical component.

Carrying out the manufacturing method for a micromechanical component also implements the above-described advantages.

Prior to forming the at least partially conductive diaphragm, the cavern may be at least partially filled with at least one sacrificial material on top of which at least one material of an inner side of the at least partially conductive diaphragm is deposited, the sacrificial material being etched away via at least one etch access formed spaced apart from the diaphragm. Since recesses/etch openings in the diaphragm may be potentially dispensed with when the manufacturing method is carried out, it is possible to reliably ensure a desired elasticity of the diaphragm.

In one advantageous specific embodiment of the manufacturing method, prior to forming the at least partially conductive diaphragm, the cavern is filled only partially with the at least one sacrificial material in such a way that at least one first cavity is formed which is covered by the at least one sacrificial material and the at least one material of the inner side of the at least partially conductive diaphragm. This ensures good undercuttability of the diaphragm while carrying out standard etching methods.

In particular, the at least one first cavity may be formed in a plurality of trenches in the substrate, which divide a bottom surface of the cavern. In this way, even a comparatively thick diaphragm is undercuttable, without a later sticking of the diaphragm, to be exposed in this way, having to be feared.

Moreover, adjoining the sacrificial material which is later etched away and/or the at least one electrically insulating material, at least one second cavity may be formed in a plurality of depressions on the inner side of the diaphragm. In particular when removing the sacrificial material with the aid of a gas phase etching method, exposure of the diaphragm is easy to implement in this case.

For example, the at least one material of the inner side of the at least partially conductive diaphragm is deposited as an LPCVD layer, into which continuous recesses for establishing positions of the depressions later formed therein are structured, the diaphragm being reinforced with the aid of an epitaxial growth process forming the depressions having the at least one second cavity present therein. It is thus possible to use method steps which are easy to carry out to form the at least one second cavity.

The above-described advantages are also implemented with a corresponding manufacturing method for a capacitive sensor device or for a microphone.

Further features and advantages of the present invention are described hereafter based on the figures.

BRIEF DESCRIPTION OF THE DRAWINGS

FIGS. 1A through 1I show schematic top views and cross sections to explain one specific embodiment of the manufacturing method for a micromechanical component.

FIG. 4 shows a schematic cross section through a third specific embodiment of the micromechanical component.

DETAILED DESCRIPTION

FIGS. 1A through 1I show schematic top views and cross sections to explain one specific embodiment of the manufacturing method for a micromechanical component.

Figure 1A:
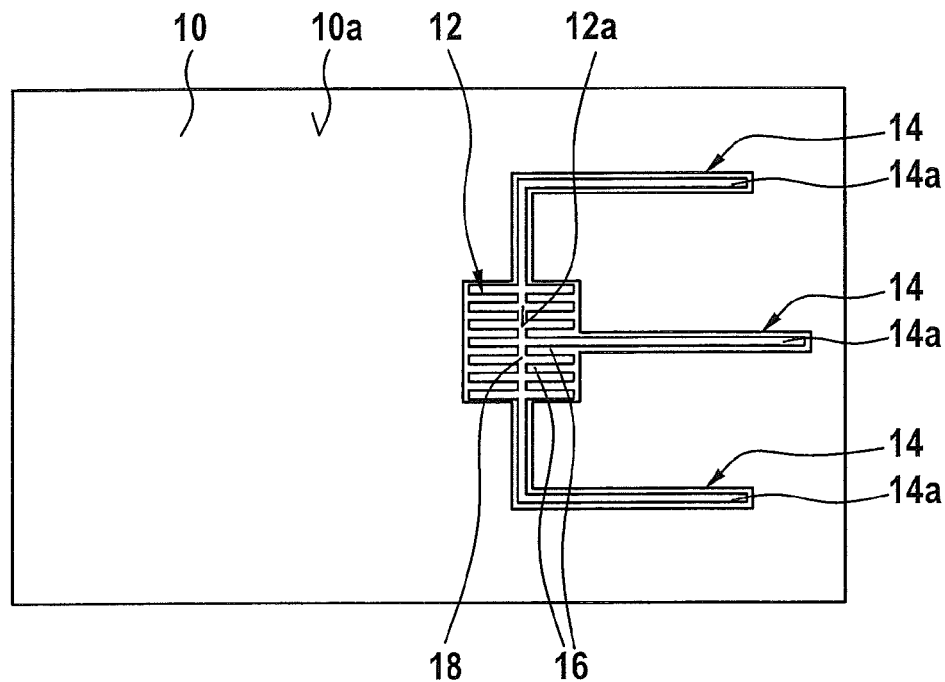

In the manufacturing method described here, an at least partially conductive diaphragm is formed, with the aid of which a cavern 12 which is structured into a functional top side 10a of a substrate 10 is at least partially spanned. Cavern 12 may be completely spanned by the at least partially conductive diaphragm. FIG. 1A shows a top view onto functional top side 10a of substrate 10.

Substrate 10 may include a semiconductor material, such as silicon. Substrate 10 may in particular be a semiconductor substrate, such as a silicon substrate. However, it is pointed out that the ability to carry out the manufacturing method described hereafter is not limited to one particular material of substrate 10.

Standard etching processes may be carried out for structuring cavern 12 into substrate 10. For etching at least cavern 12, optionally a protective layer 13 (not shown in FIG. 1A) is applied to substrate areas not to be etched. At least one channel 14 may be etched into functional top side 10 of substrate 10 simultaneously with cavern 12, the channel being usable as an etch access in a later method step. As is described in greater detail below, the at least one channel 14 may also serve as a pressure access during an operation of the finished micromechanical component. The at least one channel 14 opening into cavern 12 may be formed proceeding from a starting section 14a, which is structured into substrate 10 spaced apart from cavern 12. In particular, the at least one starting section 14a of the at least one channel 14 may be situated in such a way that its position is not covered by the diaphragm which is formed later.

Cavern 12 may be filled at least partially with at least one sacrificial material 16 before the at least partially conductive diaphragm is formed. In particular, cavern 12 (and the at least one channel 14) may be filled only partially with the at least one sacrificial material 16 in such a way that at least one first cavity 18 is formed in cavern 12. For example, the at least one first cavity 18 is formable in a plurality (not shown) of trenches in substrate 10, which divide a bottom surface 12a of cavern 12. However, the at least one first cavity 18 may also be embedded in sacrificial material 16, as is shown in FIG. 1A.

The at least one sacrificial material 16 may be an oxide, for example, in particular silicon oxide. It is particularly favorable when the at least one first cavity 18 is configured in such a way that all areas in cavern 12 are connected to each other via the at least one first cavity 18 starting from an etch access which is used later. It is thus possible to remove the at least one sacrificial material 16 very quickly and uniformly in a later sacrificial etching step.

Figure 1B:
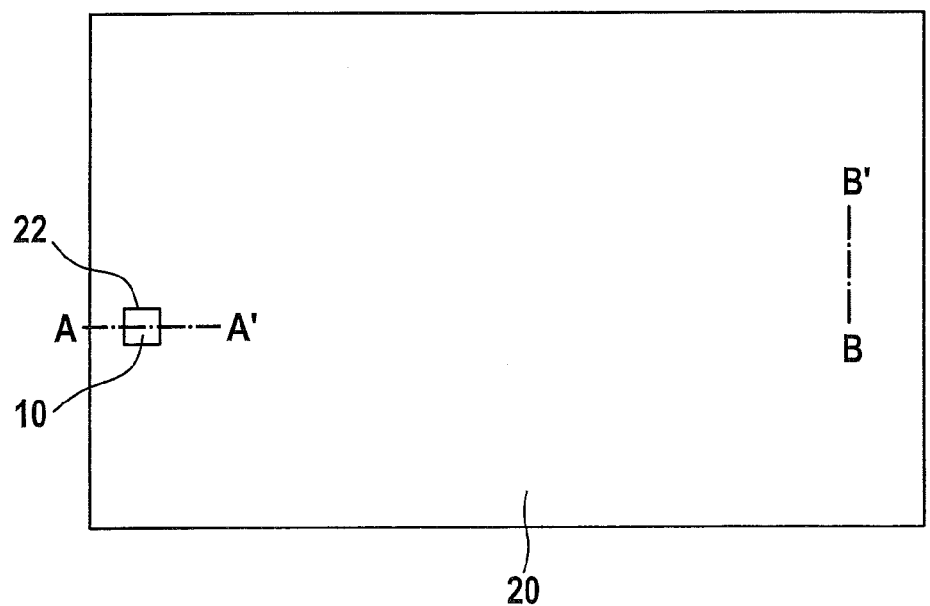
Figure 1B:
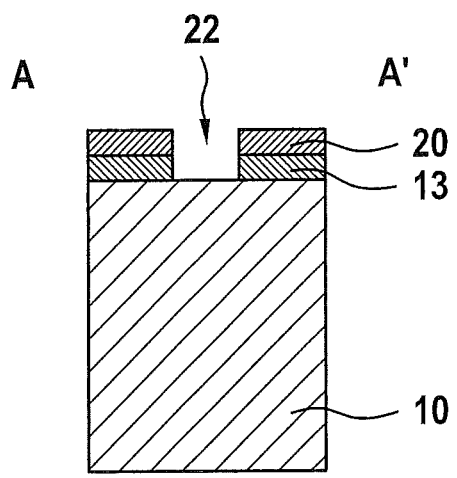
Figure 1B:
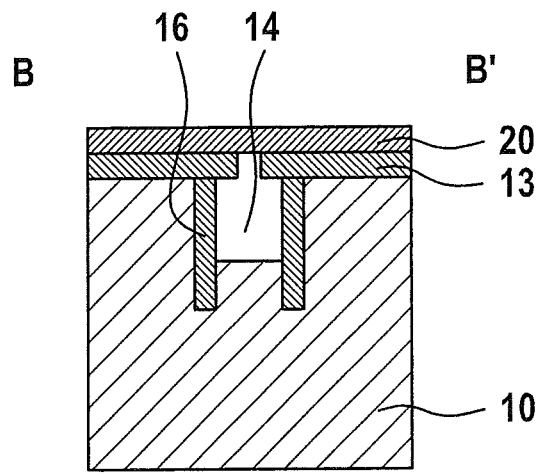
Figure 1C:
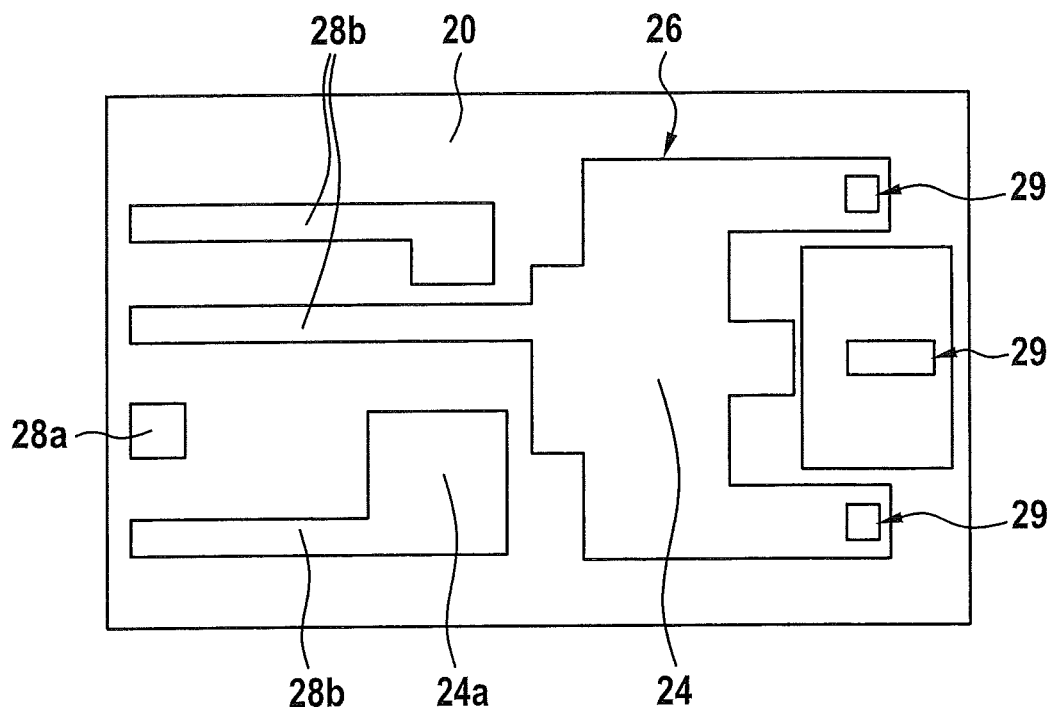
Figure 1D:
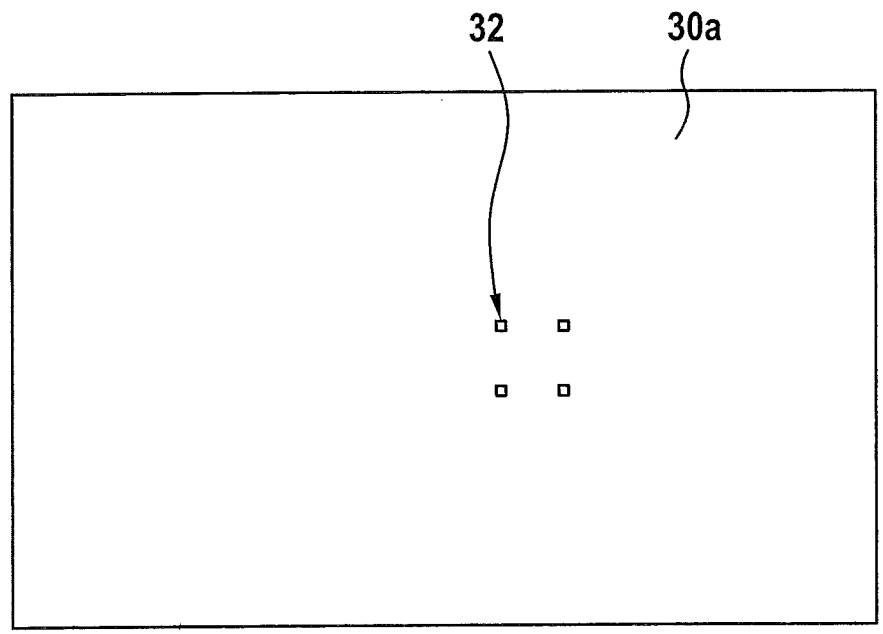

Thereafter, as is shown in FIG. 1B, functional top side 10a of substrate 10 is at least partially covered with at least one electrically insulating material 20. Cavern 12, the at least one channel 14 and/or the at least one first cavity 18 may also be covered with the at least one electrically insulating material 20. For example, at least one layer of the at least one electrically insulating material 20 may be deposited across the entire surface of functional top side 10a of substrate 10 for this purpose. Functional top side 10a of substrate 10 may be covered with at least one layer including the same material as the at least one sacrificial material 16. In particular, an oxide layer, such as a silicon oxide layer, may be deposited for this purpose. Optionally, at least one via 22 may be structured through the at least one electrically insulating material 20 to expose at least one contact surface of functional top side 10a of substrate 10. FIG. 1Ba shows a cross section along line A-A' of FIG. 1B, which leads through a via 22. The cross section of FIG. 1Bb extends along a line B-B' of FIG. 1B, which extends perpendicularly through a channel 14.

The at least partially conductive diaphragm 24 is subsequently spanned onto or over the at least one electrically insulating material 20 which at least partially covers functional top side 10a of substrate 10. The at least one first cavity 18 is thus covered by the at least one sacrificial material 16, the at least one electrically insulating material 20 and/or the at least one material of the inner side of the at least partially conductive diaphragm 24. For example, for this purpose a first semiconductor and/or metal layer 26 is deposited onto the at least one electrically insulating material 20. First semiconductor and/or metal layer 26 may be a polysilicon layer, for example.

For example, a low pressure chemical vapor deposition (LPCVD) polysilicon layer is deposited as first semiconductor and/or metal layer 26. A first semiconductor and/or metal layer 26 including a semiconductor material may be rendered at least partially conductive with the aid of a doping. Diaphragm 24/first semiconductor and/or metal layer 26 may have a layer thickness between 200 nm and 8 µm perpendicular to functional top side 10a of substrate 10.

In addition to the at least partially conductive diaphragm 24, at least one further component, such as at least one contact 28a and/or at least one printed conductor 28b, may also be structured out of first semiconductor and/or metal layer 26, for example. In the manufacturing method described here, additionally a reference diaphragm 24a is structured out of first semiconductor and/or metal layer 26. Reference diaphragm 24a may cover the at least one electrically insulating material 20 at a point which is spaced apart from cavern 12 and from the at least one channel 14 opening into the same. (The function of reference diaphragm 24a is addressed in greater detail below). When first semiconductor and/or metal layer 26 is structured, which may also be at least one area 29 of the at least one electrically insulating material 20, which is situated above the at least one starting section 14a of the at least one channel 14, is exposed.

Subsequently, at least one insulating layer 30a and 30b is deposited onto diaphragm 24. In the specific embodiment of the manufacturing method described here, at least one stop part is formed in addition to a counter electrode, the stop part having contact protrusions which are oriented toward diaphragm 24.

To implement the contact protrusions, first a first insulating layer 30a is deposited onto diaphragm 24. As is shown in FIG.

Figure 1E:
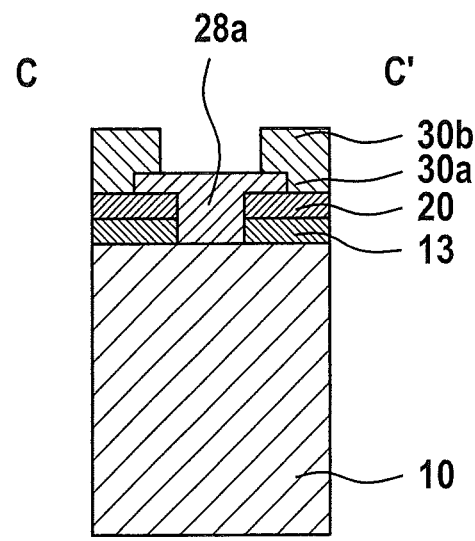
Figure 1E:
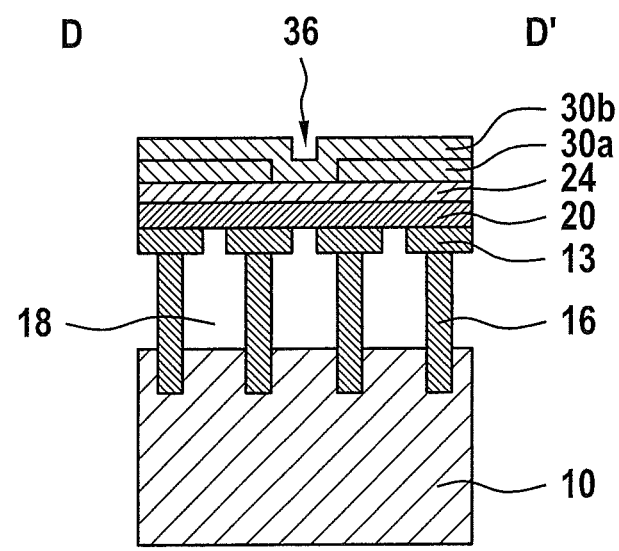

1D, the positions and the dimensions of the later contact protrusions may be established by structuring at least one continuous recess 32 through first insulating layer 30a. Thereafter, a second insulating layer 30b is formed, which covers continuous recesses 32. Insulating layers 30a and 30b may be made of the same material, such as an oxide. In an optional method step, further vias 34 may be structured through insulating layers 30a and 30b, which, for example, expose a contact area 28a of first semiconductor and/or metal layer 26. FIG. 1E shows a top view after the structuring of further vias 34. FIG. 1Ea shows a cross section through a contact area 28a which extends along line C-C' of FIG. 1E.

The advantageous procedure for forming the contact protrusions at the later stop part is schematically shown with the aid of the cross section of FIG. 1Eb extending along line D-D' of FIG. 1E. Due to the previously formed continuous recesses 32 (line D-D' extending through one continuous recess 32), the shared layer structure composed of two insulating layers 30a and 30b has a depression 36. Depression 36 corresponds to the shape of the contact protrusion which is formed later.

In the specific embodiment of the manufacturing method described here, the counter electrode is formed by depositing a second semiconductor and/or metal layer 38, which at least partially covers insulating layers 30a and 30b. For example, a polysilicon layer may be formed as second semiconductor and/or metal layer 38. Second semiconductor and/or metal layer 28 may be a low pressure chemical vapor deposition (LPCVD) polysilicon layer. A second semiconductor and/or metal layer 38 including a semiconductor material may be rendered at least partially conductive with the aid of a doping. Optionally, second semiconductor and/or metal layer 38 may be planarized with the aid of a chemical mechanical polishing (CMP) process. Second semiconductor and/or metal layer 38 may have a layer thickness between 1 µm and 50 µm perpendicular to functional top side 10a of substrate 10.

As is shown in FIG. 1F, a metallization 40, in particular made of aluminum, may also be deposited onto second semiconductor and/or metal layer 38. With the aid of metallization 40, it is possible to form reinforcements 40a, at least one contact 40b and/or at least one conductor (not shown).

Figure 1G:
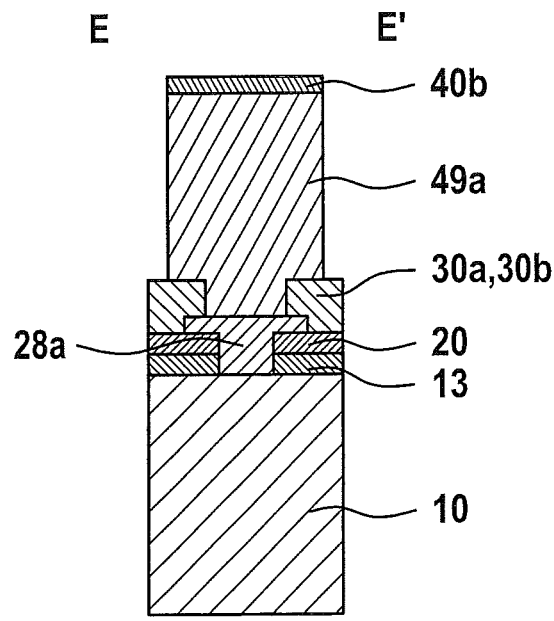
Figure 1G:
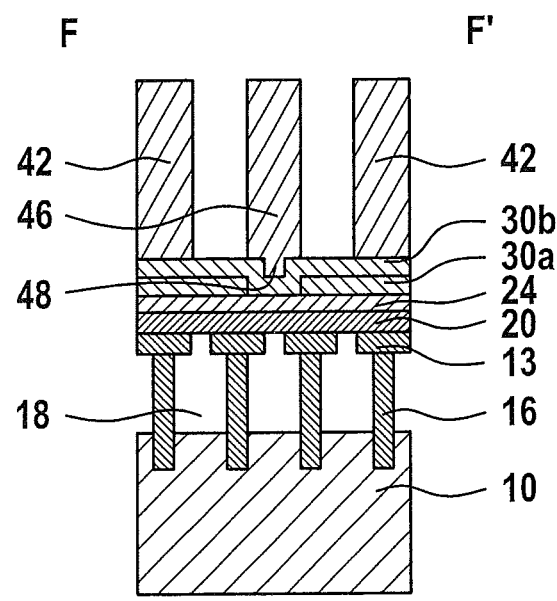

FIG. 1G shows a top view after counter electrode 42 has been structured out of second semiconductor and/or metal layer 38. Counter electrode 42 may be provided with a perforation 44, through which counter electrode 42 is completely undercuttable in a further method step. Moreover, a reference counter electrode 42a is formed from second semiconductor and/or metal layer 38 on a side of reference diaphragm 24a directed away from substrate 10 in the manufacturing method described here. FIG. 1Ga shows a cross section through a contact area 40 along line E-E' of FIG. 1G.

It is also possible to structure at least one stop part 46 having at least one contact protrusion 48 out of second semiconductor and/or metal layer 38. The at least one stop part 46 may be electrically connected to diaphragm 24. Line F-F', along which the cross section of FIG. 1Gb extends, is situated exactly on top of line D-D' of FIG. 1E and extends through a contact protrusion 48. It is apparent that the at least one contact protrusion 48 is present at a smaller distance from diaphragm 24 than counter electrode 42 (and remaining areas of the at least one stop part 46). In contrast, a distance between reference diaphragm 24a and reference counter electrode 42a corresponds to a distance between diaphragm 24 and counter electrode 42.

Moreover, at least one contact 49a and/or at least one conductor 49b may be structured out of second semiconductor and/or metal layer 38. For example, counter electrode 42 and reference counter electrode 42a may thus be configured with a shared contact 49a. Additionally, it is also possible to again expose at least one area 29 of the at least one electrically insulating material 20 situated above the at least one starting section 14a of the at least one channel 14 when structuring second semiconductor and/or metal layer 38.

Figure 1H:
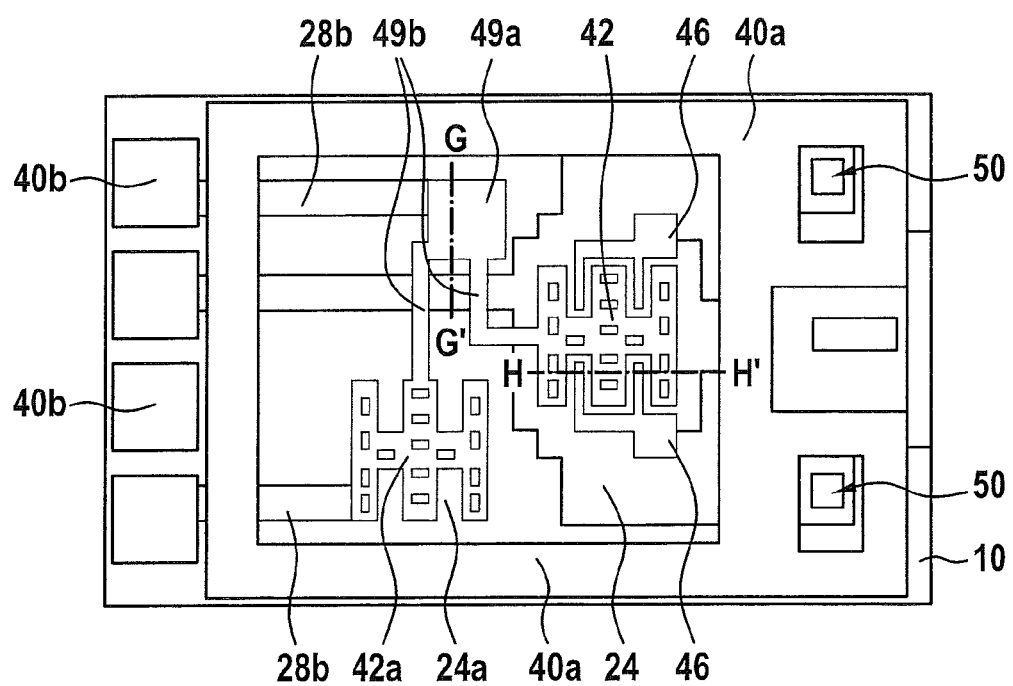
Figure 1H:
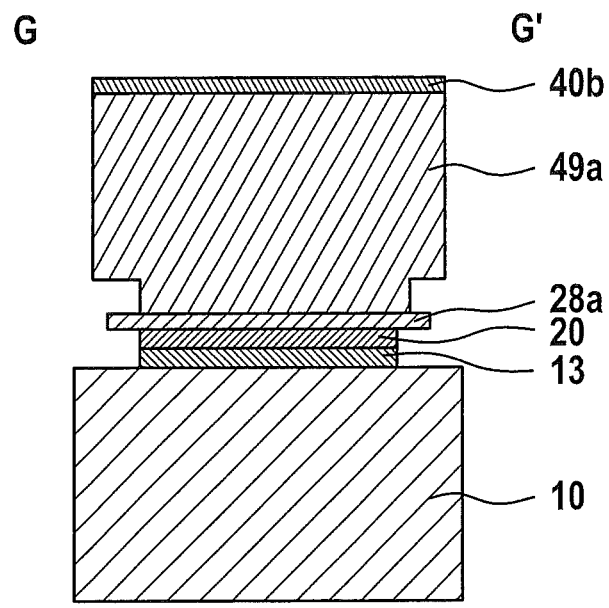
Figure 1H:
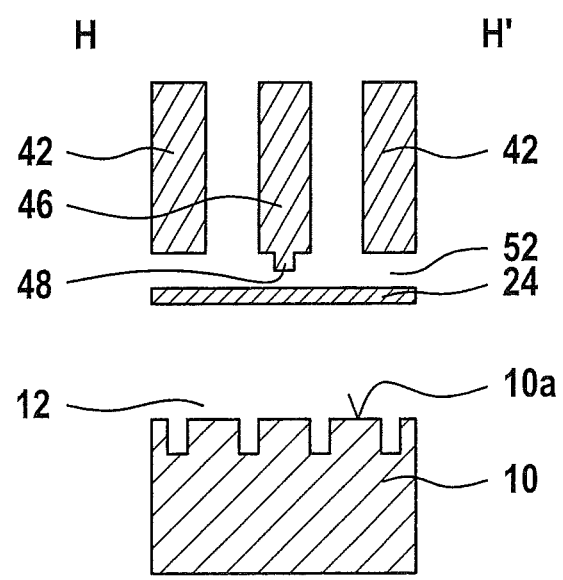

Thereafter, the at least one sacrificial material 16, the at least one electrically insulating material 20, first insulating layer 30a and/or second insulating layer 30b is/are at least partially etched away. A gas phase etching method, in particular using HF, may be used for this purpose. The at least one sacrificial material 16, on top of which at least one material of an inner side of the at least partially conductive diaphragm 24 is deposited, may be etched away via at least one etch access 50 which is (automatically) formed at the point of the at least one area 29 of the at least one electrically insulating material 20 above the at least one starting section 14a of the at least one channel 14. It is easily possible to expose diaphragm 24, as is shown in FIG. 1H, via at least one such etch access 50, which extends partially along one of channels 14. It is possible to evenly remove the at least one sacrificial material 16 even in the interior of cavern 12.

As is illustrated based on FIG. 1Ha, which shows a cross section along line G-G' of FIG. 1H, remaining areas of the at least one electrically insulating material 20 and/or of insulating layers 30a and 30b may still remain where this is desired, despite the etching method. In contrast, it is reliably ensured that the at least one sacrificial material 16 on cavern 12 is completely removed. FIG. 1Hb shows a cross section through cavern 12 along line H-H' of FIG. 1H, which is located on top of line F-F' of FIG. 1G. It is apparent that, with the manufacturing method described here, counter electrode 46 is situated on an outer side of diaphragm 24 directed away from substrate 10 in such a way that a clearance 52 is formed between counter electrode 46 and the at least partially conductive diaphragm 24.

Figure 1I:
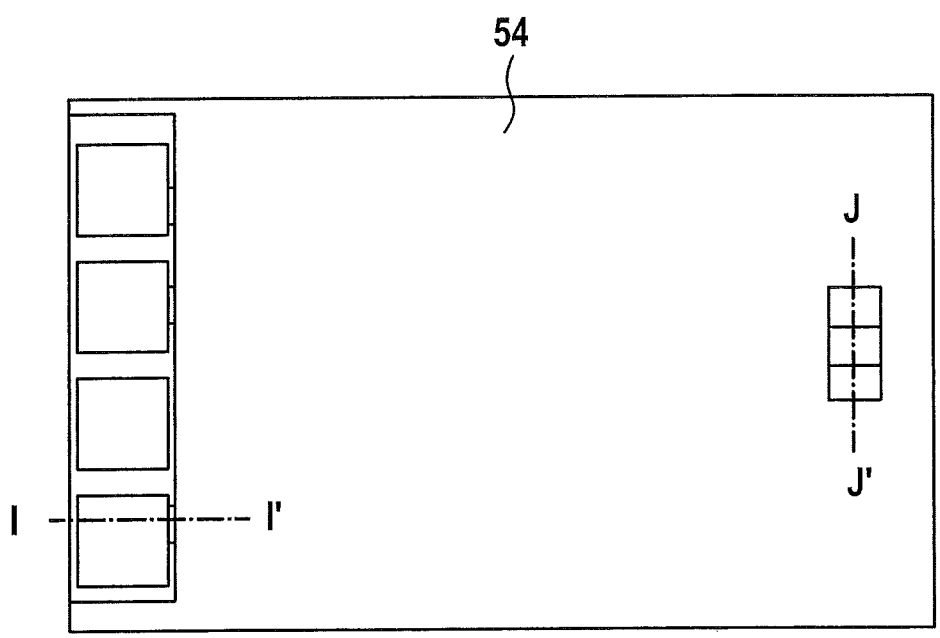
Figure 1I:
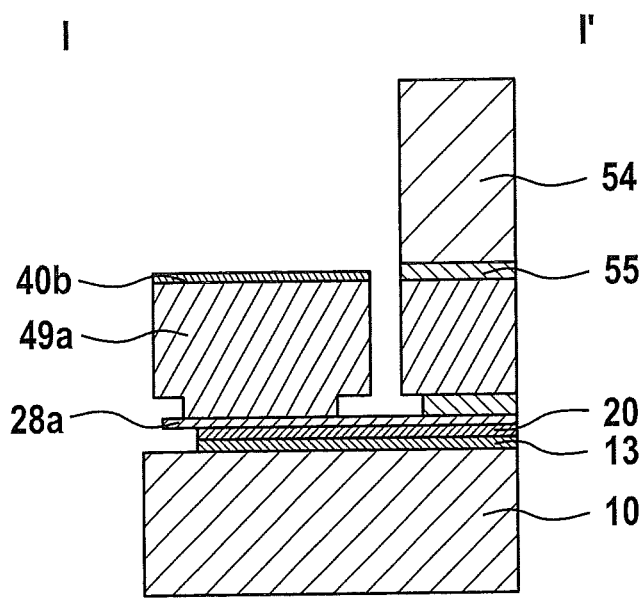
Figure 1I:
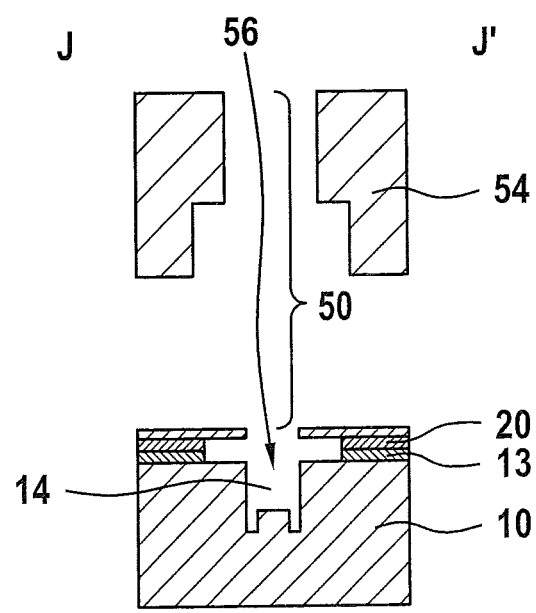

FIG. 1E shows a top view after a cap wafer 54 has been attached as a covering on a side of counter electrode 46 directed away from substrate 10. In particular, diaphragm 24 and counter electrode 46 may be hermetically sealed with the aid of cap wafer 54. If desired, specifically etch accesses 50 may be (hermetically) sealed when attaching cap wafer 54. For this purpose, cap wafer 54 may be attached to the micromechanical component with the aid of a bonding method, a soldering method and/or a (conductive) adhesive. For example, seal glass bonding or eutectic bonding is carried out for this purpose. In particular, a binary Al—Ge system or a tertiary Al—Ge—Si system may be used for fixedly bonding cap wafer 54. Advantageously, metallization 40 including aluminum is usable as a contact surface for outer contacts on the one hand, and, at the same time as a component for a bond joint 55, as is discernible based on the cross section along line I-I' of FIG. 1I shown in FIG. 1Ia.

At the same time, at least one pressure access 56 is formed on cavern 12 in such a way that the at least partially conductive diaphragm 24 is bent into clearance 52 when a gaseous medium flows from outer surroundings of the micromechanical component into cavern 12. The at least one pressure access 56 may extend at least partially over at least one etch access 50 and/or over at least one channel 14, as is illustrated in the cross section along line J-J' of FIG. 1I shown in FIG. 1Ib. At the same time, by sealing further etch accesses, it is achievable that only the one desired pressure access 56 beneath diaphragm 24 still exists, which due to its small width and/or due to at least one lattice is able to easily prevent particles from penetrating beneath diaphragm 24. The at least one lattice (not shown) may be structured out of a material of a semiconductor and/or metal layer 26 and 38, for example.

In one further specific embodiment, it is also possible to seal all etch accesses 50. In this case, a pressure access 56 may be formed from the rear side of substrate 10 via a trench through substrate 10.

As an alternative or in addition to the above-described creation of the at least one first cavity 18, it is also possible to create at least one second cavity, adjoining the sacrificial material 16 which is later etched away and/or adjoining the at least one electrically insulating material 20, in a plurality of depressions on the inner side of diaphragm 24. For this purpose, first the at least one material of the inner side of diaphragm 24 is deposited as an LPCVD layer. Thereafter, continuous recesses for establishing positions of the depressions which are later formed therein are structured into the LPCVD layer. In particular, the continuous recesses may be etched into the LPCVD layer. Afterwards, diaphragm 24 may be reinforced with the aid of an epitaxial growth process forming the depressions (on its inner side) having the at least one second cavity present therein. For this purpose, the previously structured LPCVD layer is used as a seed layer for a (rapid) epitaxial growth method. Since material is generally only deposited onto the seed layer during an epitaxial growth method, the depressions are created during the epitaxial growth process inside the inner side of diaphragm 24. The depressions may be formed in particular on border areas of diaphragm 24. It is pointed out that the depressions shall not be understood to mean openings extending through diaphragm 24. Instead, the depressions may also be described as indentations formed on the inner side of diaphragm 24. The at least one second cavity enclosed in the depressions may advantageously be used to improve the etching efficiency during the undercutting of diaphragm 24.

The micromechanical components described hereafter are producible with the aid of the above-described manufacturing method, for example. However, it is pointed out that the micromechanical components are also producible by carrying out a slightly modified manufacturing method.

Figure 2A:
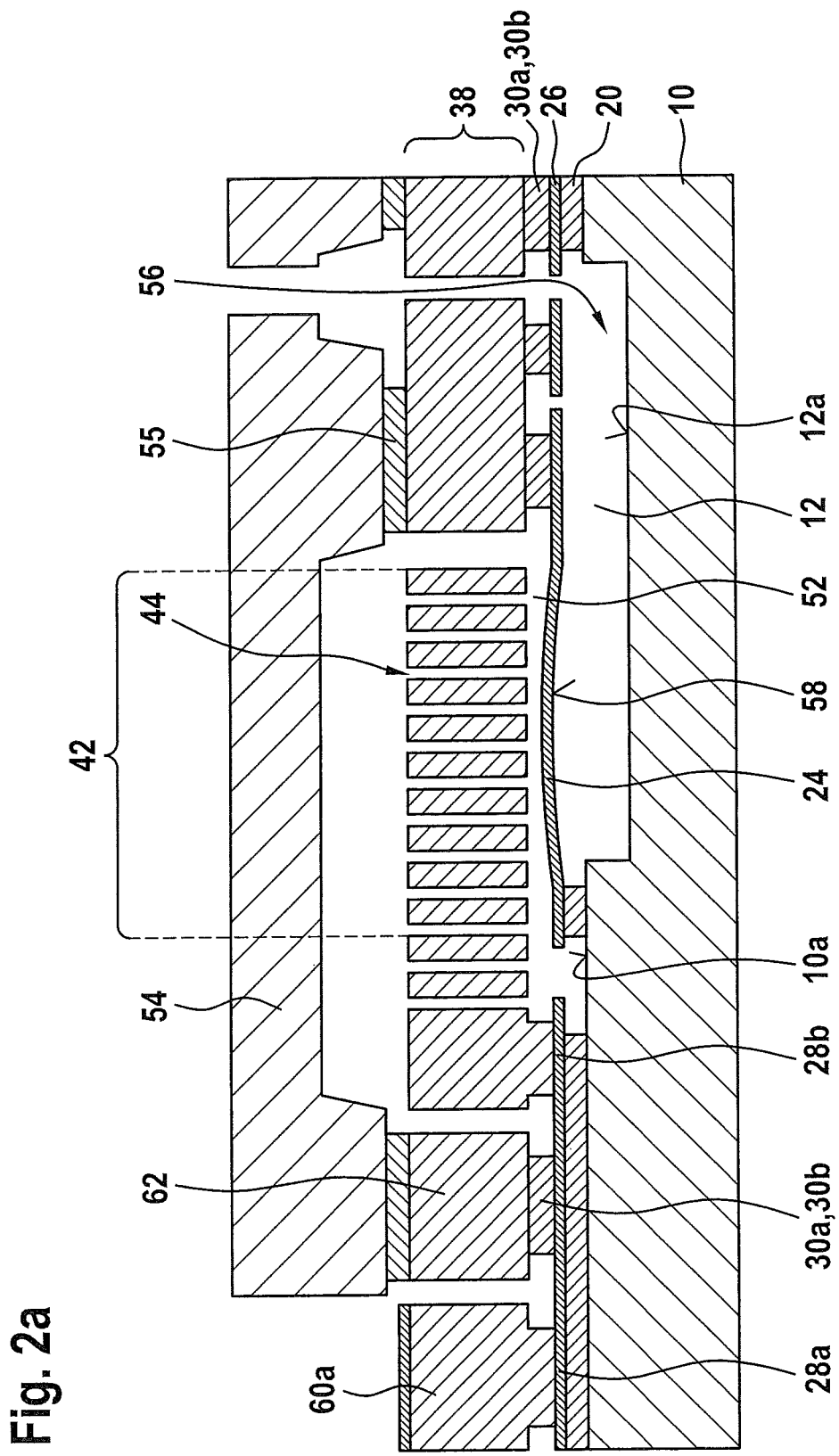
FIGS. 2a, 2b and 2c show cross sections through a first specific embodiment of the micromechanical component, the cross section of FIG. 2b extending in parallel to the cross section of FIG. 2a, and the cross section of FIG. 2c being oriented perpendicularly to the cross sections of FIGS. 2a and 2b.
Figure 2B:
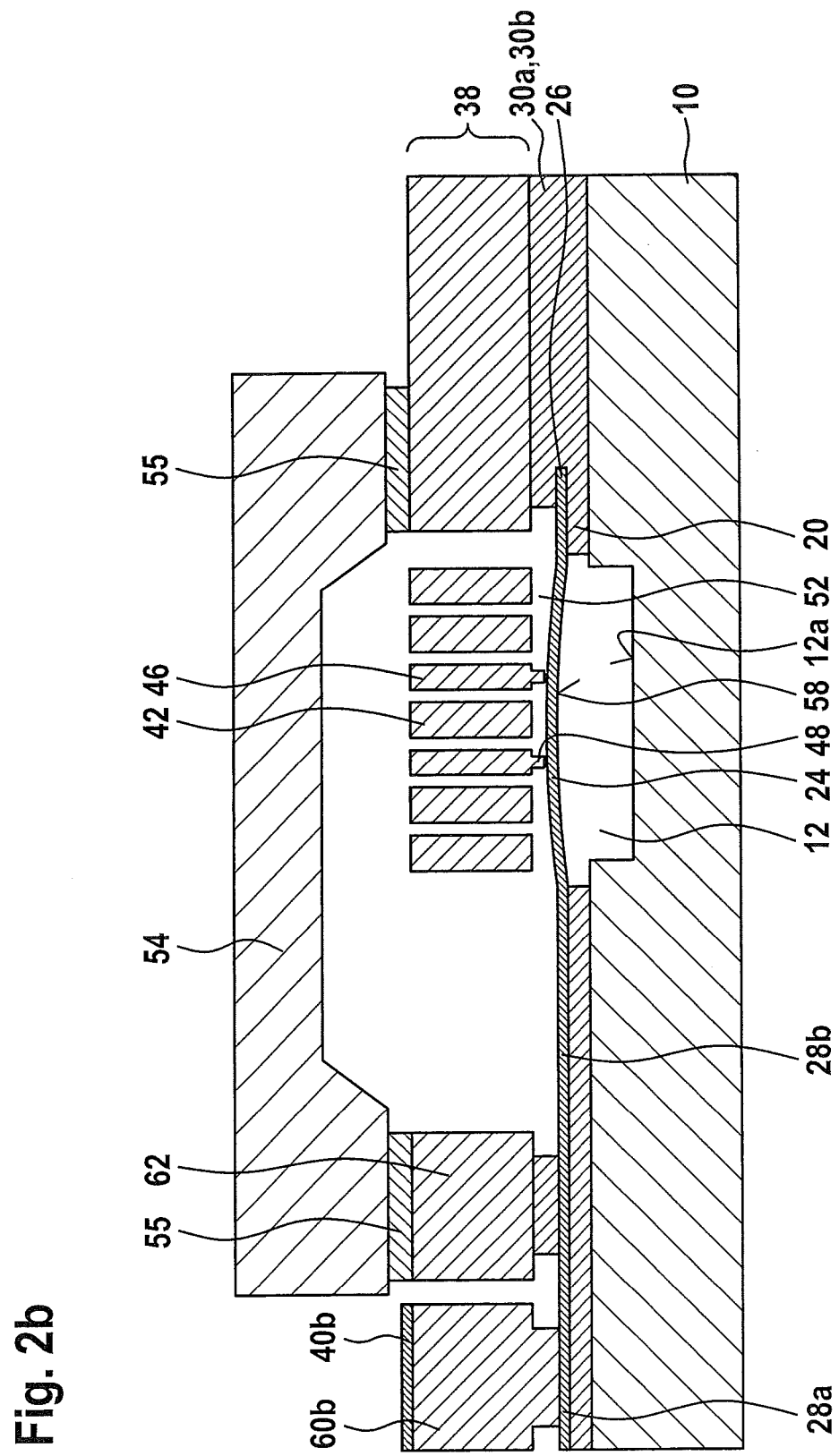
Figure 2C:
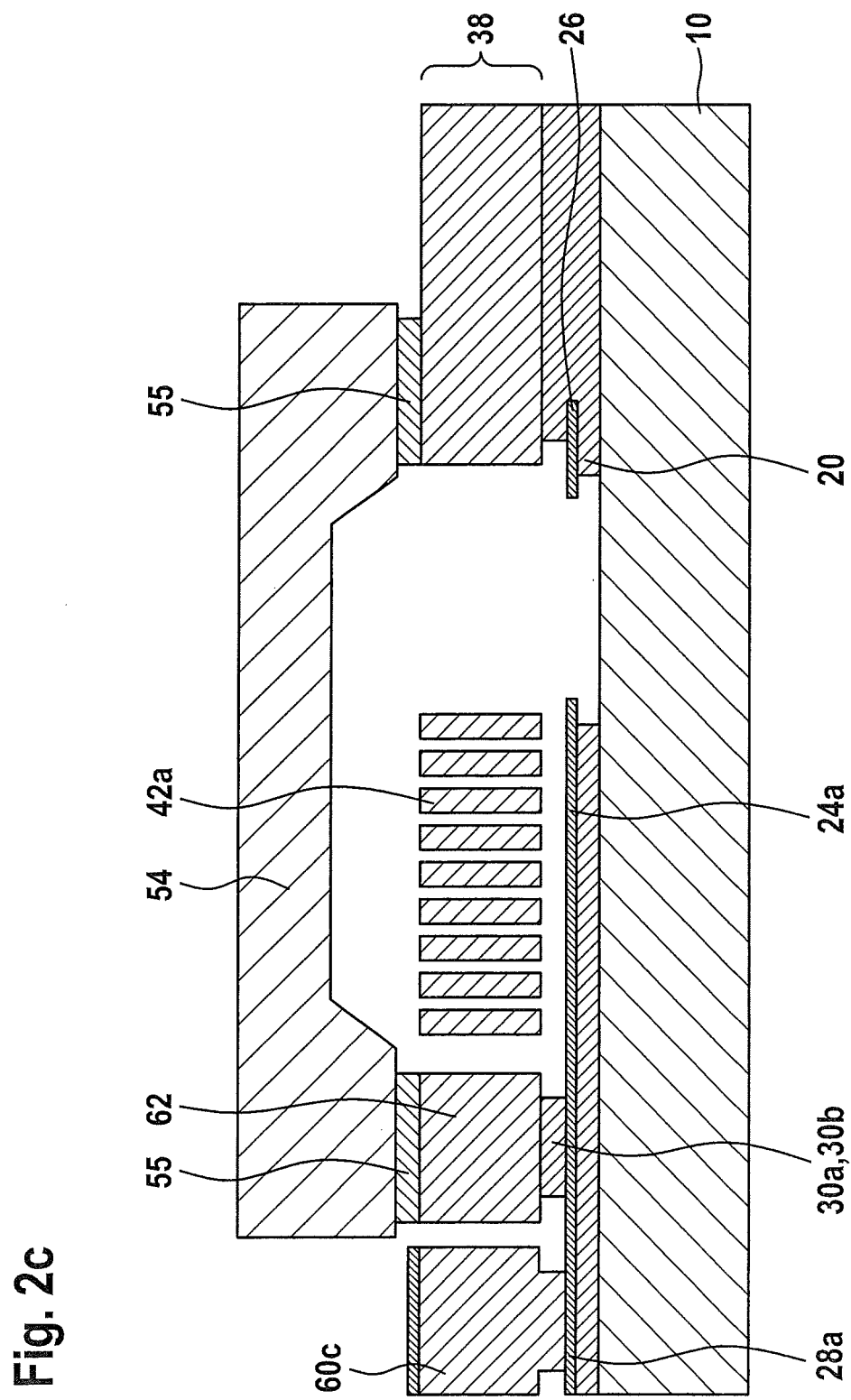

FIGS. 2a through 2c show cross sections through a first specific embodiment of the micromechanical component, the cross section of FIG. 2b extending in parallel to the cross section of FIG. 2a, and the cross section of FIG. 2c being oriented perpendicularly to the cross sections of FIGS. 2a and 2b.

The micromechanical component schematically shown in FIGS. 2a through 2c includes a substrate 10 having a cavern 12 structured into a functional top side 10a of substrate 10. Cavern 12 is at least partially spanned by an at least partially conductive diaphragm 24. In addition, the micromechanical component includes a counter electrode 42, which is situated on an outer side of diaphragm 24 directed away from substrate 10 in such a way that a clearance 52 is present between counter electrode 42 and the at least partially conductive diaphragm 24. At least partially conductive diaphragm 24 is spanned onto or over at least one electrically insulating material 20 which at least partially covers functional top side 10a of substrate 10. Moreover, at least one pressure access 56 is formed on cavern 12 in such a way that the at least partially conductive diaphragm 24 is bendable into clearance 52 when a gaseous medium flows from an outer surroundings of the micromechanical component into cavern 12.

Based on a capacitance of a capacitor formed of diaphragm 24 and counter electrode 42, a pressure present in the outer surroundings of the micromechanical component is thus ascertainable. The micromechanical component is thus suitable for a capacitive sensor device with the aid of which a pressure is reliably determinable. The capacitive sensor device is producible comparatively easily and relatively cost-effectively using known method steps. The development complexity which must be carried out for this purpose is comparatively low. Moreover, due to its arrangement, diaphragm 24 is protected very efficiently from impurities and other harmful external effects in the micromechanical component.

In one advantageous specific embodiment, a plurality of trenches may be formed in substrate 10 in such a way that a bottom surface 12a of the cavern is divided by the plurality of trenches. Accordingly, it is also possible to create a plurality of depressions on an inner side 58 of the at least partially conductive diaphragm 24, which is exposed from cavern 12. As was already described above, cavities may thus be created during the manufacture of the micromechanical component, which facilitate the exposure of diaphragm 24.

Diaphragm 24 may be structured out of a first semiconductor and/or metal layer 26. For example, at least one contact area 28a and/or at least one printed conductor 28b may be formed out of first semiconductor and/or metal layer 26. The material of a second semiconductor and/or metal layer 38 may be used for structuring out counter electrode 42. Moreover, at least one contact area 60a, 60b and 60c, a frame part 62, and/or a stop part 46 may also be formed out of second semiconductor and/or metal layer 38. Advantageously, counter electrode 42 and/or at least one further component formed out of second semiconductor and/or metal layer 38 has/have perforations 44, the creation of which makes it easier to manufacture the micromechanical component.

FIG. 2a shows a first contact 60a, which is electrically connected to counter electrode 42 via a printed conductor 28b. (A corresponding contact 60b for electrically connecting the at least partially conductive diaphragm 24 is shown in FIG. 2b.) Remaining areas of at least one insulating layer 30a and 30b may be present between the components structured out of layers 26 and 28. In this way, the at least partially conductive diaphragm 24 may be electrically insulated from counter electrode 42.

As is discernible based on FIG. 2b, the at least one stop part 46 may be present in an electrically decoupled/disconnected manner from diaphragm 24 and from counter electrode 42. Creating such a stop part 46 allows an electrical short circuit between diaphragm 24 and counter electrode 42 to be prevented, even if diaphragm 24 is strongly warped. At least one contact protrusion/at least one protruding stop surface 48 may be formed on stop part 46 for this purpose. Even with a strong warping of diaphragm 24, a contact thus occurs between the at least one contact protrusion 48 and diaphragm 24, which prevents further warping of diaphragm 24. Direct contact between diaphragm 24 and counter electrode 42 is thus reliably prevented. It is thus possible to prevent welding of diaphragm 24 to counter electrode 42 due to a direct contact between these even when a high voltage is present. In addition, there is no risk of damage to an evaluation electronics system, which could occur upon direct contact between diaphragm 24 and counter electrode 42 due to a short circuit.

The at least one contact protrusion 48 may be configured to be comparatively small. In this way, it is possible to prevent diaphragm 24 from sticking to the at least one contact protrusion 48, even if diaphragm 24 is very soft.

In one refinement, a reference capacitance may also be formed on the micromechanical component. FIG. 2c shows a reference diaphragm 24a (made of first semiconductor and/or metal layer 26) which is fixedly connected to the substrate for this purpose, and a reference counter electrode 42a (made of second semiconductor and/or metal layer 38), which is immovably situated on a side of reference diaphragm 24a directed away from substrate 10. While reference counter electrode 42*a* may be electrically connected to counter electrode 42, reference diaphragm 24*a* may be contactable via a dedicated contact 60*c*.

On a micromechanical component having a reference capacitance, the externally applied pressure may be inferred from a particularly precise measurement of a difference between a first capacitance between diaphragm 24 and counter electrode 42 and a second capacitance between reference diaphragm 24*a* and reference counter electrode 42*a*. Potential drifts of the capacitances due to aging processes or temperature fluctuations may thus be prevented, or at least drastically reduced, since temperature and age influences generally impact both capacitances equally.

In one further advantageous refinement, at least one covering, such as a cap wafer 54, is attached to the micromechanical component. In the specific embodiment shown in FIGS. 2*a* through 2*c*, a cap wafer 54 is attached to frame part 62 with the aid of a bond joint 55. As an alternative to bond joint 55, however, a covering may also be attached to the micromechanical component with the aid of a soldered joint or with the aid of a (conductive) adhesive.

It is favorable to enclose what may be a low internal pressure as the reference pressure in a space between the covering and the counter electrode. A pressure lower than 100 mbar may be enclosed. To arrive at what may be a stable internal pressure in the intermediate volume, it may additionally be advantageous to provide a depression in the covering to achieve a good volume-to-surface ratio. For example, a getter material may be used in the covering, which maintains the reference pressure in what may be a defined manner at a low pressure.

Figure 3:
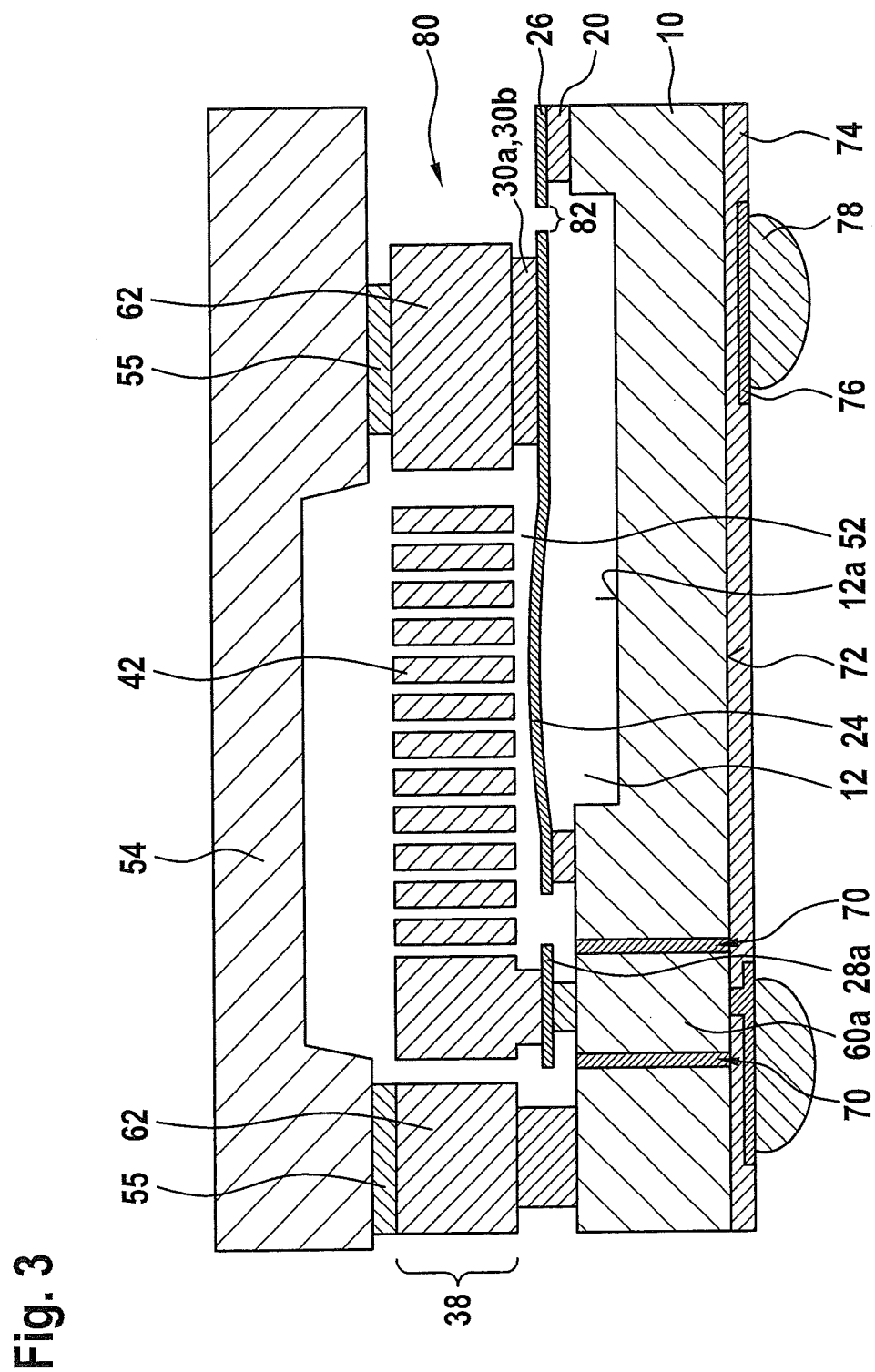
FIG. 3 shows a schematic cross section through a second specific embodiment of the micromechanical component.

FIG. 3 shows a schematic cross section through a second specific embodiment of the micromechanical component.

In the micromechanical component of FIG. 3, contact 60*a*, which is connected to counter electrode 42, is structured out of substrate 10. For this purpose, continuous recesses 70 (through silicon vias) are structured/etched through substrate 10. On a rear side 72 of substrate 10, which is directed away from components 24 and 42 and which optionally is at least partially covered by an insulating layer 74, printed conductors 76 and bond joints 78 may be formed, via which an electrical contact with counter electrode 42 is ensured.

Contrary to the above-described specific embodiment, the micromechanical component of FIG. 3 has a lateral channel 80 which runs between a capping 54 and substrate 10 (in the plane of second semiconductor and/or metal layer 38) and which extends from an outer area of the micromechanical component up to an opening 82 in first semiconductor and/or metal layer 26. Cavern 12 is connected to lateral channel 80 via opening 82. Thus, no structuring of capping 54 is required, in particular in combination with recesses 70 running through substrate 10.

FIG. 4 shows a schematic cross section through a third specific embodiment of the micromechanical component.

The micromechanical component schematically shown in FIG. 4 includes a circuit-populated further substrate 84, such as an ASIC, instead of a capping which is structured out of a cap wafer. For example, circuit-populated further substrate 84 may be configured with an operator and/or an evaluation circuit for operating the micromechanical component as a sensor component and/or for evaluating sensor signals ascertained therewith. Printed conductors 76 and bond joints 78 may be formed on circuit-populated further substrate 84 in such a way that an electrical contact and/or a signal transmission from a side of circuit-populated further substrate 84 which is directed away from diaphragm 24 is possible. Such a routing of the electrical contacts to the outside allows a compact configuration of the micromechanical component and facilitates its operation. A pressurization of diaphragm 34 may take place at a rear side channel 86 which is structured through substrate 10 and may open into cavern 12.

All above-described specific embodiments of the micromechanical component are usable in a capacitive sensor device. A capacitive sensor device thus implemented may in particular carry out a function of a pressure sensor. However, in one advantageous refinement, the capacitive sensor device may also carry out the functions of an acceleration sensor, of a yaw rate sensor and/or of a magnetic field sensor. One refinement of each of the above-described micromechanical components as (part of) an acceleration sensor is possible, for example, by attaching a seismic mass to diaphragm 24. Each of the above-described micromechanical components is also usable for measuring a magnetic field when a magnetized part is situated on diaphragm 24.

Moreover, above-described stop parts 46 may also be connected to a dedicated contact. In this way, an adjustment movement of a counter electrode 42, which is adjustably situated with the aid of at least one spring, in a direction oriented in parallel to diaphragm 24 is detectable. The micromechanical component may thus be configured as a combination of a pressure sensor and an acceleration sensor, in which counter electrode 42 is usable as the seismic mass.

In one further specific embodiment of the capacitive sensor device, it is also possible to form multiple micromechanical components having a diaphragm 24 in each case. In this case, forming diaphragms 24 in different sizes may be advantageous in order to have at least one sensitive diaphragm 24 for different measuring ranges, such as for different pressure ranges, for example. In particular, differently sized diaphragms 24 may be connected in parallel, either to linearize a not entirely linear deformation of an individual diaphragm 24, to linearize a combination of many different diaphragms 24, or to deliberately generate a non-linear characteristic curve, with the aid of which a larger measuring range/pressure range is resolvable. As an alternative, it is possible to situate multiple identical diaphragms 24 in parallel on a capacitive sensor device to increase an overall resulting sensor signal, at the same time it being possible to keep a size and degree of warping of individual diaphragms 24 low.

Moreover, it may be advantageous to also situate a yaw rate sensor, an acceleration sensor and/or a magnetic field sensor in the hermetically sealed area, in addition to the implemented pressure sensor. For this purpose, further components may be structured out of first semiconductor and/or metal layer 26 and/or out of second semiconductor and/or metal layer 38. All these sensors may be selectively configured with one, two or three channels.

The technology according to the present invention is thus also usable for generating capacitive sensor devices including a plurality of sensitive elements for different physical variables. The technology according to the present invention also allows a capacitive pressure sensor, a capacitive acceleration sensor, a capacitive yaw rate sensor and/or a magnetic field sensor to be integrated on/into the same chip.

The capacitive sensor device may be operated using known capacitive evaluation circuits, such as evaluation circuits of acceleration sensors. In particular, combined sensors may be evaluated together with the aid of a purely capacitive evaluation circuit. With a suitable configuration of a capacitive pressure sensor, for example, the front end architecture of an acceleration sensor of the same sensor device may also be used for the capacitive pressure sensor. This is easy to implement either by multiplexing a shared front end for pressure and acceleration or via a further front end channel.

The advantageous capacitive sensor device may be used in a consumer terminal, for example, such as in particular in a mobile telephone.

What is claimed is:

1. A micromechanical component, comprising:
    a substrate having a cavern structured into a functional top side of the substrate;
    an at least partially conductive diaphragm, which at least partially spans the cavern; and
    a counter electrode, which is situated on an outer side of the diaphragm directed away from the substrate so that a clearance is present between the counter electrode and the at least partially conductive diaphragm;
    wherein the at least partially conductive diaphragm is spanned onto or over at least one electrically insulating material which at least partially covers the functional top side of the substrate, and
    wherein at least one pressure access is formed on the cavern so that the at least partially conductive diaphragm is bendable into the clearance when a gaseous medium flows from an outer surroundings of the micromechanical component into the cavern.

2. The micromechanical component of claim 1, wherein a plurality of trenches is formed in the substrate so that a bottom surface of the cavern is divided by the plurality of trenches.

3. The micromechanical component of claim 1, wherein a plurality of depressions is formed on an inner side of the at least partially conductive diaphragm, which is exposed from the cavern.

4. A capacitive sensor device, comprising:
    a micromechanical component, including:
        a substrate having a cavern structured into a functional top side of the substrate;
        an at least partially conductive diaphragm, which at least partially spans the cavern; and
        a counter electrode, which is situated on an outer side of the diaphragm directed away from the substrate so that a clearance is present between the counter electrode and the at least partially conductive diaphragm;
        wherein the at least partially conductive diaphragm is spanned onto or over at least one electrically insulating material which at least partially covers the functional top side of the substrate, and
        wherein at least one pressure access is formed on the cavern so that the at least partially conductive diaphragm is bendable into the clearance when a gaseous medium flows from an outer surroundings of the micromechanical component into the cavern.

5. A microphone, comprising:
    a micromechanical component, including:
        a substrate having a cavern structured into a functional top side of the substrate;
        an at least partially conductive diaphragm, which at least partially spans the cavern; and
        a counter electrode, which is situated on an outer side of the diaphragm directed away from the substrate so that a clearance is present between the counter electrode and the at least partially conductive diaphragm;
        wherein the at least partially conductive diaphragm is spanned onto or over at least one electrically insulating material which at least partially covers the functional top side of the substrate, and
        wherein at least one pressure access is formed on the cavern so that the at least partially conductive diaphragm is bendable into the clearance when a gaseous medium flows from an outer surroundings of the micromechanical component into the cavern.

6. A manufacturing method for a micromechanical component, the method comprising:
    forming an at least partially conductive diaphragm, with the aid of which a cavern which is structured into a functional top side of a substrate is at least partially spanned; and
    forming a counter electrode, which is situated on an outer side of the diaphragm directed away from the substrate, a clearance being formed between the counter electrode and the at least partially conductive diaphragm;
    wherein the at least partially conductive diaphragm is spanned onto or over at least one electrically insulating material which at least partially covers the top side of the substrate, and
    wherein at least one pressure access is formed on the cavern so that the at least partially conductive diaphragm is bent into the clearance when a gaseous medium flows from an outer surroundings of the micromechanical component into the cavern.

7. The manufacturing method of claim 6, wherein, prior to forming the at least partially conductive diaphragm, the cavern is filled at least partially with at least one sacrificial material on top of which at least one material of an inner side of the at least partially conductive diaphragm is deposited, the sacrificial material being etched away via at least one etch access formed spaced apart from the diaphragm.

8. The manufacturing method of claim 7, wherein, prior to forming the at least partially conductive diaphragm, the cavern is filled only partially with the at least one sacrificial material so that at least one first cavity is formed which is covered by the at least one sacrificial material, at least one of the at least one electrically insulating material and the at least one material of the inner side of the at least partially conductive diaphragm.

9. The manufacturing method of claim 8, wherein the at least one first cavity is formed in a plurality of trenches in the substrate, which divide a bottom surface of the cavern.

10. The manufacturing method of claim 7, wherein, adjoining the sacrificial material which is later etched away and/or adjoining the at least one electrically insulating material, at least one second cavity is formed in a plurality of depressions on the inner side of the diaphragm.

11. The manufacturing method of claim 10, wherein the at least one material of the inner side of the at least partially conductive diaphragm is deposited as an LPCVD layer, into which continuous recesses for establishing positions of the depressions later formed therein are structured, the diaphragm being reinforced with the aid of an epitaxial growth process forming the depressions having the at least one second cavity present therein.

12. A manufacturing method for a sensor device, the method comprising:
    situating a micromechanical component at least one of in and on a sensor arrangement;
    wherein the micromechanical component includes:
        a substrate having a cavern structured into a functional top side of the substrate;
        an at least partially conductive diaphragm, which at least partially spans the cavern; and
        a counter electrode, which is situated on an outer side of the diaphragm directed away from the substrate so that a clearance is present between the counter electrode and the at least partially conductive diaphragm;
        wherein the at least partially conductive diaphragm is spanned onto or over at least one electrically insulating material which at least partially covers the functional top side of the substrate, and wherein at least one pressure access is formed on the cavern so that the at least partially conductive diaphragm is bendable into the clearance when a gaseous medium flows from an outer surroundings of the micromechanical component into the cavern.

13. A manufacturing method for a microphone, the method comprising:
situating a micromechanical component at least one of in and on a microphone arrangement;
wherein the micromechanical component includes:
a substrate having a cavern structured into a functional top side of the substrate;
an at least partially conductive diaphragm, which at least partially spans the cavern; and
a counter electrode, which is situated on an outer side of the diaphragm directed away from the substrate so that a clearance is present between the counter electrode and the at least partially conductive diaphragm;
wherein the at least partially conductive diaphragm is spanned onto or over at least one electrically insulating material which at least partially covers the functional top side of the substrate, and
wherein at least one pressure access is formed on the cavern so that the at least partially conductive diaphragm is bendable into the clearance when a gaseous medium flows from an outer surroundings of the micromechanical component into the cavern.

14. A manufacturing method for a sensor device, the method comprising:
forming a micromechanical component, by performing the following:
forming an at least partially conductive diaphragm, with the aid of which a cavern which is structured into a functional top side of a substrate is at least partially spanned; and
forming a counter electrode, which is situated on an outer side of the diaphragm directed away from the substrate, a clearance being formed between the counter electrode and the at least partially conductive diaphragm;
wherein the at least partially conductive diaphragm is spanned onto or over at least one electrically insulating material which at least partially covers the top side of the substrate, and
wherein at least one pressure access is formed on the cavern so that the at least partially conductive diaphragm is bent into the clearance when a gaseous medium flows from an outer surroundings of the micromechanical component into the cavern; and
situating the micromechanical component at least one of in and on a sensor arrangement.

15. The manufacturing method of claim 14, wherein, prior to forming the at least partially conductive diaphragm, the cavern is filled at least partially with at least one sacrificial material on top of which at least one material of an inner side of the at least partially conductive diaphragm is deposited, the sacrificial material being etched away via at least one etch access formed spaced apart from the diaphragm.

16. The manufacturing method of claim 15, wherein, prior to forming the at least partially conductive diaphragm, the cavern is filled only partially with the at least one sacrificial material so that at least one first cavity is formed which is covered by the at least one sacrificial material, at least one of the at least one electrically insulating material and the at least one material of the inner side of the at least partially conductive diaphragm.

17. The manufacturing method of claim 16, wherein the at least one first cavity is formed in a plurality of trenches in the substrate, which divide a bottom surface of the cavern.

18. The manufacturing method of claim 15, wherein, adjoining the sacrificial material which is later etched away and/or adjoining the at least one electrically insulating material, at least one second cavity is formed in a plurality of depressions on the inner side of the diaphragm.

19. The manufacturing method of claim 18, wherein the at least one material of the inner side of the at least partially conductive diaphragm is deposited as an LPCVD layer, into which continuous recesses for establishing positions of the depressions later formed therein are structured, the diaphragm being reinforced with the aid of an epitaxial growth process forming the depressions having the at least one second cavity present therein.

20. A manufacturing method for a microphone, the method comprising:
forming a micromechanical component, by performing the following:
forming an at least partially conductive diaphragm, with the aid of which a cavern which is structured into a functional top side of a substrate is at least partially spanned; and
forming a counter electrode, which is situated on an outer side of the diaphragm directed away from the substrate, a clearance being formed between the counter electrode and the at least partially conductive diaphragm;
wherein the at least partially conductive diaphragm is spanned onto or over at least one electrically insulating material which at least partially covers the top side of the substrate, and
wherein at least one pressure access is formed on the cavern so that the at least partially conductive diaphragm is bent into the clearance when a gaseous medium flows from an outer surroundings of the micromechanical component into the cavern; and
situating the micromechanical component at least one of in and on a microphone arrangement.

21. The manufacturing method of claim 20, wherein, prior to forming the at least partially conductive diaphragm, the cavern is filled at least partially with at least one sacrificial material on top of which at least one material of an inner side of the at least partially conductive diaphragm is deposited, the sacrificial material being etched away via at least one etch access formed spaced apart from the diaphragm.

22. The manufacturing method of claim 21, wherein, prior to forming the at least partially conductive diaphragm, the cavern is filled only partially with the at least one sacrificial material so that at least one first cavity is formed which is covered by the at least one sacrificial material, at least one of the at least one electrically insulating material and the at least one material of the inner side of the at least partially conductive diaphragm.

23. The manufacturing method of claim 22, wherein the at least one first cavity is formed in a plurality of trenches in the substrate, which divide a bottom surface of the cavern.

24. The manufacturing method of claim 21, wherein, adjoining the sacrificial material which is later etched away and/or adjoining the at least one electrically insulating material, at least one second cavity is formed in a plurality of depressions on the inner side of the diaphragm.

25. The manufacturing method of claim 24, wherein the at least one material of the inner side of the at least partially conductive diaphragm is deposited as an LPCVD layer, into which continuous recesses for establishing positions of the depressions later formed therein are structured, the diaphragm being reinforced with the aid of an epitaxial growth process forming the depressions having the at least one second cavity present therein.

26. The micromechanical component of claim 1, wherein a plurality of trenches is formed in the substrate so that a bottom surface of the cavern is divided by the plurality of trenches, and wherein a plurality of depressions is formed on an inner side of the at least partially conductive diaphragm, which is exposed from the cavern.

\* \* \* \* \*